(12) United States Patent
Pearson et al.

(10) Patent No.: US 10,635,411 B2
(45) Date of Patent: Apr. 28, 2020

(54) SYSTEM AND METHOD OF LOCATING INSTALLED DEVICES

(71) Applicant: Honeywell International Inc., Morristown, NJ (US)

(72) Inventors: Charles T. Pearson, Northford, CT (US); Jonathan W. Leach, Killingworth, CT (US); George J. Magyar, Wallingford, CT (US)

(73) Assignee: Honeywell International Inc., Morris Plains, NJ (US)

( * ) Notice: Subject to any disclaimer, the term of this patent is extended or adjusted under 35 U.S.C. 154(b) by 355 days.

(21) Appl. No.: 14/656,244

(22) Filed: Mar. 12, 2015

(65) Prior Publication Data
US 2016/0266556 A1    Sep. 15, 2016

(51) Int. Cl.
| G05B 13/04 | (2006.01) |
| G06F 9/44 | (2018.01) |
| G06F 17/50 | (2006.01) |
| G06F 8/34 | (2018.01) |

(52) U.S. Cl.
CPC ............ G06F 8/34 (2013.01); G06F 17/5004 (2013.01)

(58) Field of Classification Search
CPC ............................... G06F 17/5004; G06F 8/34
See application file for complete search history.

(56) References Cited

U.S. PATENT DOCUMENTS

| 5,979,607 | A * | 11/1999 | Allen | G06Q 90/205 |
| | | | | 187/390 |
| 6,144,289 | A * | 11/2000 | Le Bel | G08B 17/10 |
| | | | | 200/52 R |
| 7,995,096 | B1 * | 8/2011 | Cressy | G08B 13/19691 |
| | | | | 348/143 |
| 8,990,049 | B2 * | 3/2015 | Plocher | G06F 17/5004 |
| | | | | 703/1 |
| 9,251,687 | B2 * | 2/2016 | Thompson | G08B 21/10 |
| 9,398,413 | B1 * | 7/2016 | Scalise | H04W 4/023 |
| 2002/0167587 | A1 * | 11/2002 | Ogasawara | H04N 7/183 |
| | | | | 348/89 |

(Continued)

FOREIGN PATENT DOCUMENTS

| WO | WO2003/091865 | * | 4/2003 | ............... G06F 3/00 |
| WO | WO 2003/091865 A1 | * | 4/2003 | ............... G06F 3/00 |

OTHER PUBLICATIONS

GLANSER: A Scalable Emergency Responder Locator System, WPI Workshop, Aug. 1, 2011.

(Continued)

*Primary Examiner* — Kenneth M Lo
*Assistant Examiner* — Mohammad A Rahman
(74) *Attorney, Agent, or Firm* — Brooks, Cameron & Huebsch, PLLC

(57) ABSTRACT

A graphically based tool and method for generating programming for a fire monitoring system. The locations of existing devices, such as detectors, in a building being monitored, can be visually presented in the context of the building. New devices can be installed, or the location of existing devices changed since all devices report their locations in the building to the tool. Device location information can be combined with building information to create a multi-dimensional representation of parts of the building being monitored.

18 Claims, 2 Drawing Sheets

(56) References Cited

U.S. PATENT DOCUMENTS

| | | | | |
|---|---|---|---|---|
| 2005/0021309 | A1* | 1/2005 | Alexander | H04L 41/22 702/188 |
| 2008/0062167 | A1* | 3/2008 | Boggs | G06F 17/5004 345/419 |
| 2008/0088437 | A1* | 4/2008 | Aninye | G07C 9/00111 340/539.13 |
| 2009/0043504 | A1* | 2/2009 | Bandyopadhyay | G01C 17/38 701/469 |
| 2009/0049386 | A1* | 2/2009 | Rekimoto | G06F 3/0481 715/719 |
| 2009/0057424 | A1* | 3/2009 | Sullivan | G05B 15/02 236/51 |
| 2012/0310602 | A1* | 12/2012 | Jacobi | G06F 17/5004 703/1 |
| 2014/0080410 | A1* | 3/2014 | Jung | H04B 5/00 455/41.1 |
| 2015/0043887 | A1* | 2/2015 | Gurudoss | G08B 13/19691 386/230 |
| 2015/0052469 | A1* | 2/2015 | Dharmalingam | G06F 3/04842 715/771 |
| 2015/0327010 | A1* | 11/2015 | Gottschalk | G06F 17/50 455/456.1 |
| 2015/0347740 | A1* | 12/2015 | O'Malley | G06F 21/36 726/4 |

OTHER PUBLICATIONS

Research aims to improve firefighter tracking, Aug. 1, 2011, http://www.firerescue1.com/fire-products/Firefighter-Accountability/articles/1088012-Res . . . , Feb. 10, 2015.

Honeywell Tests GLANSER System to Locate and Track Firefighters, Posted Apr. 26, 2012, http://www.honeywellnow.com/2012/04/26/honeywell-tests-glanser-system-to-locate-and-tr . . . , Feb. 9, 2015.

Donny Jackson, New technology improves firefighter location, Nov. 8, 2012, http://urgentcomm.com/personnel-tracking/new-technology-improves-firefighter-location, Feb. 9, 2015.

Rachel Metz, MIT Technology Review, No Map? No GPS? No Problem, Mar. 21, 2013, http://www.technologyreview.com/news/512661/no-map-no-gps-no-problem/. Mar. 11, 2015.

Jane Jerrard, Indoor Firefighter Locator System from Cambridge Consultants, May 21, 2013, http://www.firefighternation.com/article/technology/indoor-firefighter-locator-system-cam . . . , Mar. 11, 2015.

Dhiren Chauhan, Contributor, Holy Grail of firefighter tracking on the horizon, May 19, 2014, http://www.firerescue1.com/fire-products/communications/articles/1916468-Holy-Grail-of . . . , Feb. 10, 2015.

* cited by examiner

SYSTEM AND METHOD OF LOCATING INSTALLED DEVICES

FIELD

The application pertains to control systems and methods of managing large numbers of detectors used in monitoring regions of interest. More particularly, the application pertains such systems and methods which provide tools which can be used to locate and provide visual representations of devices in a region of interest, as well as visually assisting in the installation or altering of locations of devices in such systems.

BACKGROUND

Fire, security and building control systems are complicated and time-consuming to program and install. Extensive planning is required to ensure that addressable devices are installed in precise locations, so that they may be programmed to cooperate in a specific manner with each other during fires or other emergencies. Installers must take time and care to install and address the systems according to a specific engineering plan, or it will not operate correctly.

Current systems use programming methods text-based. Text-based programming requires that a plethora of information be programmed for each device in the system. Text-based programming offers no visual feedback to the programmer of the physical space being programmed. Text-based programming may not be easily interpreted by someone unfamiliar with the site or site layout.

DETAILED DESCRIPTION

Figure 1:
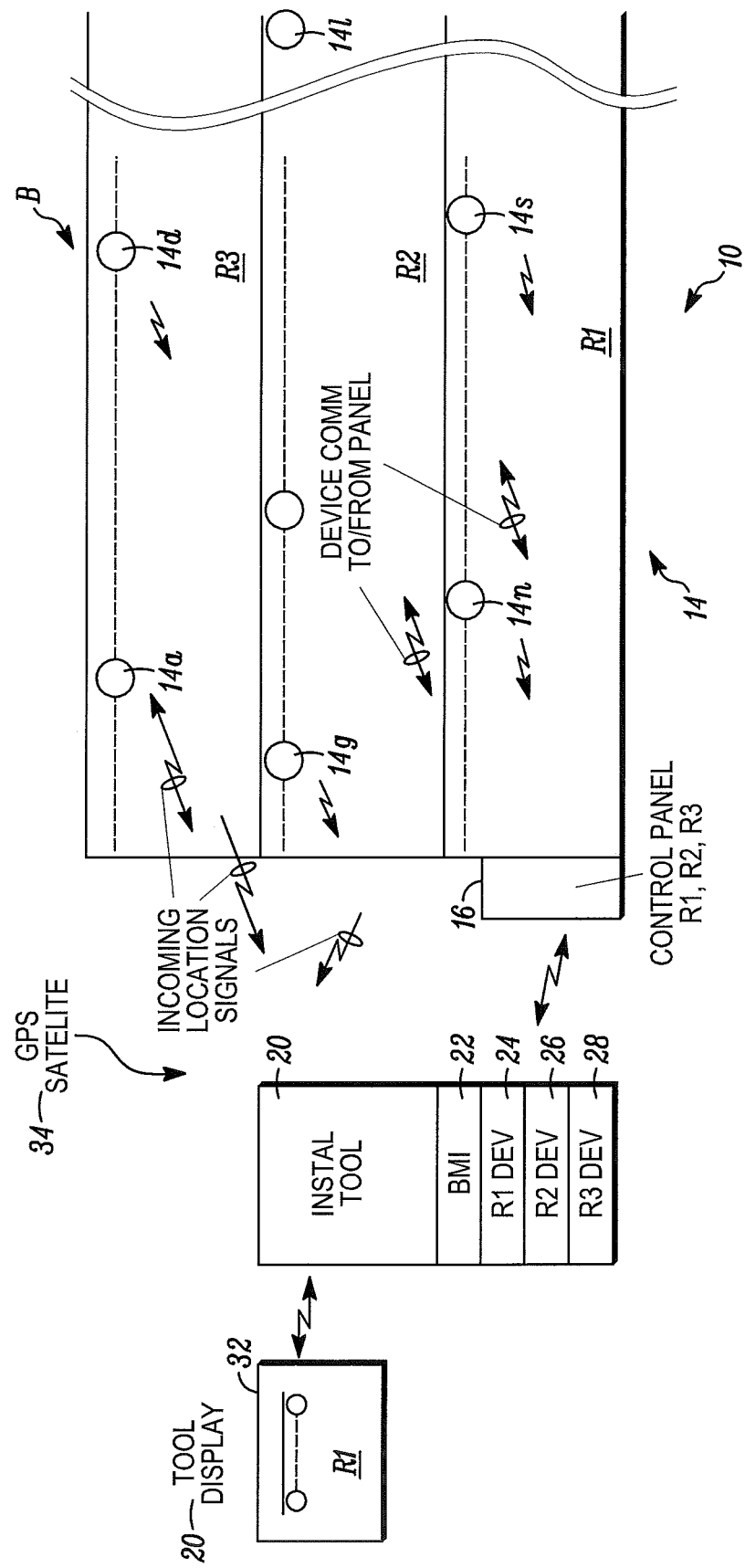
FIG. 1 illustrates a block diagram of a system in accordance herewith.

While disclosed embodiments can take many different forms, specific embodiments thereof are shown in the drawings and will be described herein in detail with the understanding that the present disclosure is to be considered as an exemplification of the principles thereof as well as the best mode of practicing same, and is not intended to limit the application or claims to the specific embodiment illustrated.

In one aspect, embodiments hereof reduce the time to program the fire, security, building management or other systems by providing the installer with an accurate, 3-D visual representation of the installed system. The installation time is reduced by eliminating the need to specify and follow addressing requirements for the devices.

A unique location identifying system provides information as to the precise location of installed devices. Device location is combined with satellite or other types of aerial imagery and/or Building Information Modeling (BIM) to obtain a detailed installation configuration, including the physical locations of all of the enabled devices within an installation.

In one embodiment, an installer can use the graphical representation of the system to generate the programming for the applicable system. An installation tool can create more accurate default programming than can current systems. By selecting devices with a tool which knows the location of each device the system installer can more quickly and accurately program a complex system.

In another aspect, an installer can view a precise location in space for an active device or devices, rather than a text description which may not be properly interpreted. The tool can use BIM and system feedback to direct the installer, or anyone else, through the building or site to the location in question. For example, directing the user to the proper staircase to be used to reach the desired location, rather than just providing spatial coordinates.

In another aspect, the system can be used with BIM information and inhabitant tracking to provide up to date directions for people on-site who need to be evacuated or directed to a certain area. In this case the location of active devices can be interpreted by the system, which would then select the most efficient way for individuals in the region to avoid an emergency or to reach a desired location. This information could be presented in many ways, including but not limited to audio messaging, SMS messages, and signage.

In yet another aspect, device location information can be provided by circuitry developed to track first responder locations in buildings during an incident. A variety of such responder tracking systems are publicly available, as would be known by those of skill in the art. One example is the publicly disclosed Geo-spatial Location, Accountability and Navigation System for Emergency Responders, GLANSER. responder locating system. Technology such as, but not limited to, that used in the GLANSER locating system can be incorporated into fire alarm, security, building control or other devices to provide their respective locations to a local position monitoring system of the type disclosed herein. A tool can retrieve the location of all the devices installed in the system. That information can be used to build a 3-D map of the region of interest. That 3-D map can be combined with BIM and aerial imagery to create a virtual map of the region and the local fire detection system.

The virtual map could then be used in a graphical installation tool with a graphical user interface. The interface enables the user to highlight physical space and program attributes common to fire alarm, security or other systems, to the devices or a subset of devices in that space. This advantageously provides a more user-friendly graphical interface for system control, and, makes the system easier to program and diagnose than one requiring text-entry of information for all devices.

The map could also be used to direct first responders to the proper location, show possible obstacles between the user and the objective, to direct other people within an installation to the proper location (exits, safe rooms, etc.), show the location of hidden/obstructed devices for maintenance or other purposes, or be used for additional applications.

FIG. 1 illustrates aspects of a configuration 10 of the type above. In FIG. 1, a building B has three floors, regions R1, R2, and R3. Members of a plurality 14 of detectors or other devices useful in an alarm system are installed throughout those regions. The members of the plurality communicate with a control panel 16 as would be understood by those of skill in the art. Advantageously, each of the detectors such as 14$i$, includes position identifying circuitry of the type described above.

Configuration 10 includes an installation tool 20 which obtains the location information from each of the members of the plurality 14. Tool 20 can be implemented with circuitry to receive the incoming position signals, along with a BMI model 22 and storage 24, 26, 28 to receive location and other information from detectors, or devices from the plurality 14.

The tool 20, as described above, can implement a 3D-type display of some or all of regions R1, R2 and R3 along with locations and information as to members of the plurality 14, Tool 20 can present such displays on local graphical user interface, and display device 32.

Data can also be acquired by the tool 20 via GPS satellite 34. Such data, while useful, does not include information or photos within closed structures.

Figure 2:
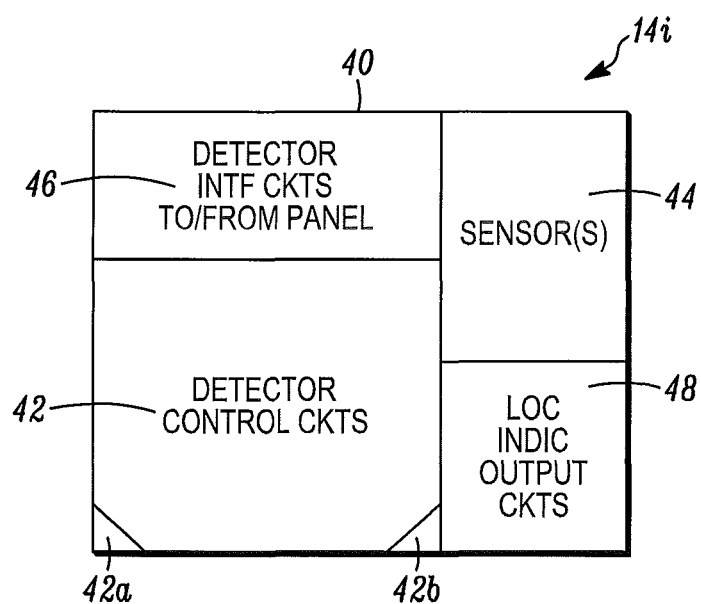
FIG. 2 is a diagram of a detector usable in the system of FIG. 1.

FIG. 2 illustrates an exemplary member 14*i* of the plurality 14. Detector 14*i* includes a housing 40 which carries control circuits 42. The control circuits 42 can be implemented, at least in part with one or more programmable processors 42*a* and associated executable control software 42*b*.

Housing 40 also carries one or more sensors 44, coupled to control circuits 42. Sensors 44 could include, without limitation, fire related sensors, such as smoke, flame or heat sensors. Alternately, sensors 44 could include gas sensors, or security related sensors.

Housing 40 also includes detector interface circuits for communication with the control panel 16. Such communications could be via wired or wireless mediums. Housing 40 can also carry location indicating output circuits and transceivers, radios for example, for automatically emitting position information to be detected by the tool 20. Such position information for the regions Ri can be stored, and updated by tool 20, in storage elements 24, 26, 28.

Those of skill will also understand that the plurality 14 can include output devices, for example audio or visual output devices, or control elements such as door locks, fan or heating controls or the like without limitation.

In summary, as described above, the members of the plurality 14 will update and automatically emit location information for the respective device. The locations of existing devices, such as detectors, in a building being monitored, can be visually presented in the context of the building. New devices can be installed, or the location of existing devices changed since all devices report their locations in the building to the tool. Device location information can be combined with building information to create a multi-dimensional representation of parts of the building being monitored.

From the foregoing, it will be observed that numerous variations and modifications may be effected without departing from the spirit and scope hereof. It is to be understood that no limitation with respect to the specific apparatus illustrated herein is intended or should be inferred. It is, of course, intended to cover by the appended claims all such modifications as fall within the scope of the claims. Further, logic flows depicted in the figures do not require the particular order shown, or sequential order, to achieve desirable results. Other steps may be provided, or steps may be eliminated, from the described flows, and other components may be add to, or removed from the described embodiments.

The invention claimed is:

1. A method comprising:
creating a multi-dimensional model of a selected building from a combination of aerial imagery of the selected building and a building information model of the selected building;
obtaining a respective location of each one of devices of a fire alarm system deployed in the selected building and incorporating a respective indicator of the respective location of each one of the devices into the multi-dimensional model of the building;
a user interface displaying a multi-dimensional image of the multi-dimensional model of the selected building with the respective indicator of the respective location of each one of the devices;
receiving first user input via the user interface selecting a particular area within the multi-dimensional model;
receiving second user input via the user interface to program attributes of the fire alarm system to each one of the devices having the respective location within the particular area;
directing a user via the multi-dimensional image displayed on the user interface to a location; and
showing obstacles between the user and the location via the multi-dimensional image displayed on the user interface.

2. The method as in claim 1 further comprising at least one of adding another device to the selected building, changing the respective location of a first of the devices in the selected building, and removing a second of the devices.

3. The method as in claim 1 further comprising changing a building data base to reflect alterations in a population of the devices.

4. The method as in claim 3 further comprising altering the population by manipulating the multi-dimensional image.

5. The method as in claim 4 wherein manipulating includes moving at least one of the devices from a displayed first location in the multi-dimensional image to a second, different, displayed location in the multi-dimensional image.

6. The method as in claim 1 wherein each one of the devices provides the respective location to a building data base.

7. The method as in claim 6 further comprising altering a population of the devices by manipulating the multi-dimensional image.

8. The method as in claim 7 further comprising providing a fire alarm control panel for the selected building and coupling the devices thereto.

9. The method as in claim 8 further comprising coupling the user interface to the fire alarm control panel.

10. The method as in claim 9 wherein the user interface includes a graphical display interface enabling graphical programming of the fire alarm control panel and the devices.

11. The method as in claim 10 wherein the devices are selected from a class that includes at least condition sensing input devices and alarm indicating output devices.

12. The method as in claim 11 further comprising releasably coupling the user interface to the fire alarm control panel and to the building data base.

13. The method as in claim 12 further comprising directing at least some of the devices to report the respective location to the fire alarm control panel.

14. An apparatus comprising:
a plurality of devices of a fire alarm system, wherein each of the plurality of devices includes respective wireless location specifying circuitry that automatically emits respective location information;
a control unit coupled to the plurality of devices;
a device installation tool including a building data base and associated control circuits coupled to the control unit, wherein the control circuits implement an interactive model of a building from a combination of aerial imagery of the building and a building information model of the building stored in the building data base and incorporate a respective indicator of the respective location information of each of the plurality of devices into the interactive model of the building; and a user interface including a visual display unit coupled to the control circuits to display the interactive model of the building, wherein the user interface receives first user input selecting a particular area within the interactive model, wherein the user interface receives second user input to program attributes of the fire alarm system to each of the plurality of devices having the respective indicator of the respective location, and wherein the user interface shows the location of hidden devices of the plurality of devices for maintenance.

15. The apparatus as in claim 14 wherein the control circuits respond to the respective location information from an added, newly installed device to locate the added, newly installed device on the interactive model of the building and provide a display of the added newly installed device on the visual display unit.

16. The apparatus as in claim 15 wherein each of the plurality of devices is selected from a class that includes at least ambient condition detectors, smoke detectors, gas detectors, thermal detectors, humidity detectors, and alarm indicating pull stations.

17. The apparatus as in claim 15 wherein each of the plurality of devices transmits respective device specifying information with the respective location information to the device installation tool.

18. The apparatus as in claim 17 wherein the plurality of devices includes at least one of detectors and annunciators.

* * * * *